United States Patent
Chen et al.

(10) Patent No.: US 9,478,474 B2
(45) Date of Patent: Oct. 25, 2016

(54) METHODS AND APPARATUS FOR FORMING PACKAGE-ON-PACKAGES

(71) Applicant: Taiwan Semiconductor Manufacturing Company, Ltd., Hsin-Chu (TW)

(72) Inventors: Hsu-Hsien Chen, Hsin-Chu (TW);
Chih-Hua Chen, Jhubei (TW);
En-Hsiang Yeh, Hsin-Chu (TW);
Monsen Liu, Zhudong Township (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 327 days.

(21) Appl. No.: 13/729,902

(22) Filed: Dec. 28, 2012

(65) Prior Publication Data

US 2014/0185264 A1     Jul. 3, 2014

(51) Int. Cl.
*H05K 7/06*     (2006.01)
*H01L 23/31*     (2006.01)

(52) U.S. Cl.
CPC . *H01L 23/3128* (2013.01); *H01L 2224/16225* (2013.01); *H01L 2224/32145* (2013.01)

(58) Field of Classification Search
CPC ...................................................... H05K 7/006
USPC .......................................................... 361/760
See application file for complete search history.

(56) References Cited

U.S. PATENT DOCUMENTS

| | | | | |
|---|---|---|---|---|
| 8,227,702 | B2* | 7/2012 | Ikeda | H05K 1/113 174/256 |
| 2004/0016996 | A1* | 1/2004 | Tang | H01L 21/481 257/678 |
| 2009/0315154 | A1* | 12/2009 | Kirby | H01L 21/743 257/621 |
| 2010/0102327 | A1* | 4/2010 | Standing | H01L 23/492 257/76 |
| 2012/0211885 | A1* | 8/2012 | Choi | H01L 23/3128 257/737 |

* cited by examiner

*Primary Examiner* — Jenny L Wagner
*Assistant Examiner* — Michael P McFadden
(74) *Attorney, Agent, or Firm* — Slater Matsil, LLP

(57) ABSTRACT

Methods and apparatus are disclosed for a package or a package-on-package (PoP) device. An IC package or a PoP device may comprise an electrical path connecting a die and a decoupling capacitor, wherein the electrical path may have a width in a range from about 8 um to about 44 um and a length in a range from about 10 um to about 650 um. The decoupling capacitor and the die may be contained in a same package, or at different packages within a PoP device, connected by contact pads, redistribution layers (RDLs), and connectors.

20 Claims, 4 Drawing Sheets

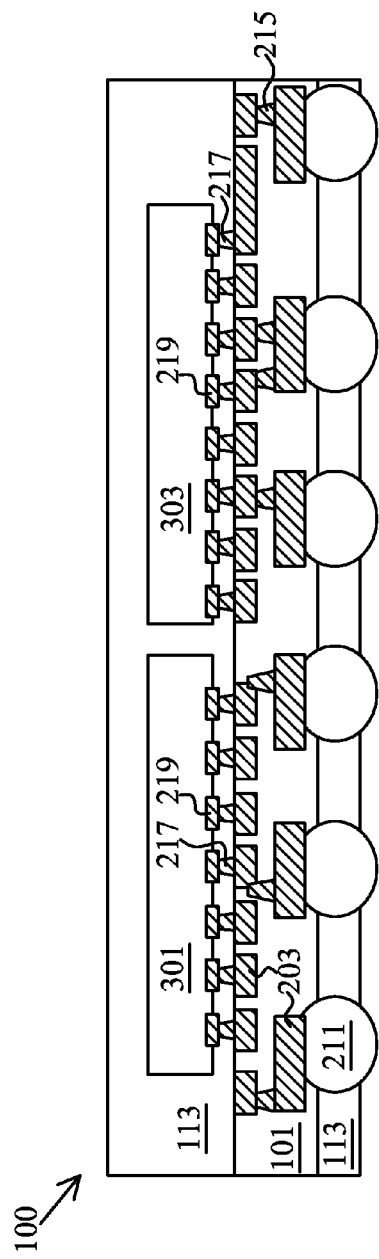
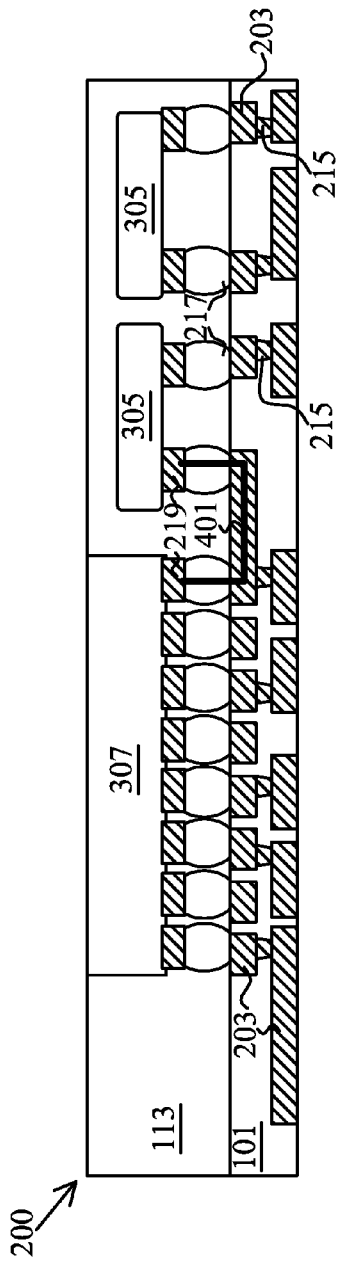
Figure 1(a)
Figure 1(b)

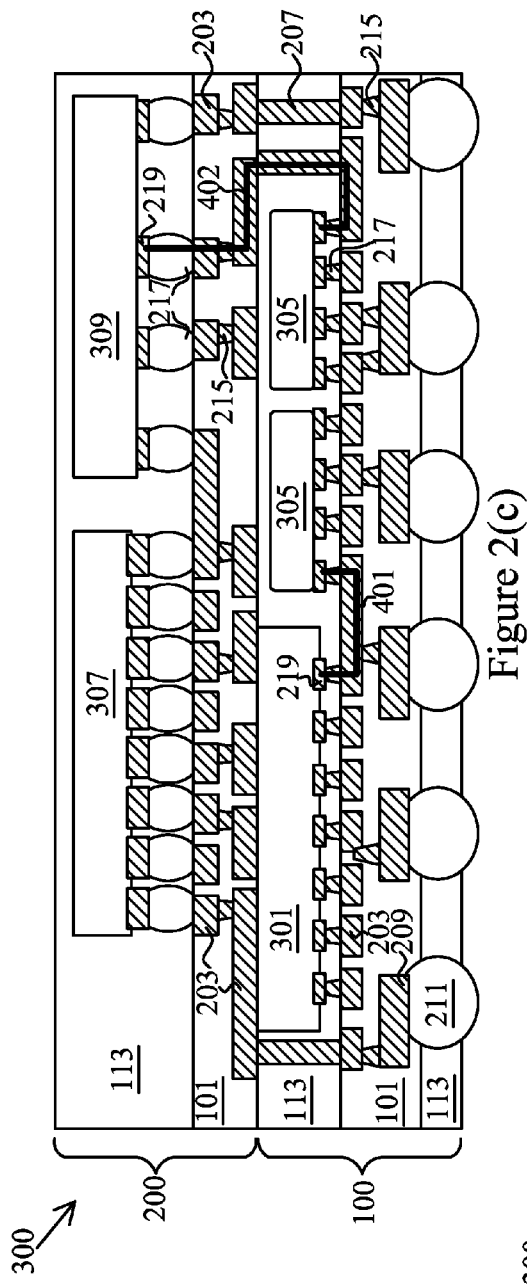
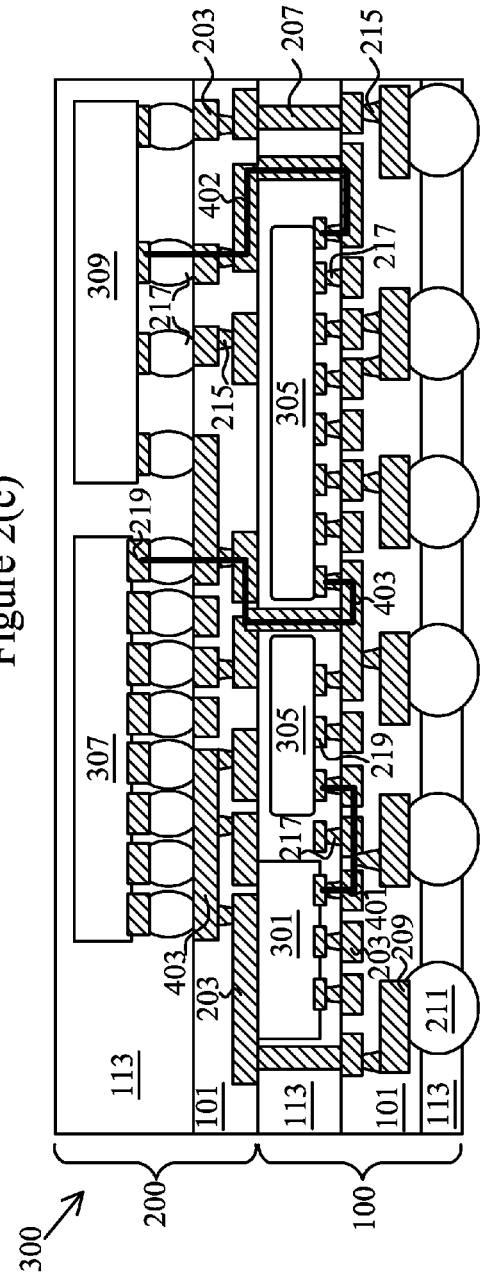

METHODS AND APPARATUS FOR FORMING PACKAGE-ON-PACKAGES

BACKGROUND

Electronics can be divided into a simple hierarchy consisting of devices such as integrated circuit (IC) chips, packages, printed circuit boards (PCB), and systems. The package is the interface between an IC chip, and a PCB. IC dies are made from semiconductor materials such as silicon. Dies are then assembled into a package such as a quad flat pack (QFP), pin grid array (PGA), or ball grid array (BGA), using wire bonding (WB), tape automated bonding (TAB), or flip chip (FC) bumping assembly techniques. The packaged die is then attached either directly to a PCB or to another substrate, which is defined as the second level of packaging.

Ball grid array (BGA) packaging technology is an advanced semiconductor packaging technology, which is characterized in that an IC die is mounted on a front side of a substrate, and a plurality of conductive elements such as solder balls are arranged in a matrix array, customarily referred to as ball grid array, on a backside of the substrate. The BGA allows the semiconductor package to be bonded and electrically connected to an external PCB or other electronic devices. The BGA package may be employed in a memory such as Dynamic Random Access Memory (DRAM) and others.

A flip-chip (FC) packaging technology comprises an IC die, an interconnect system, and a substrate. An IC die is connected to the front side of the substrate with a plurality of solder bumps, wherein the solder bumps forming a metallurgical interconnection between the die and the substrate. The die, the solder bump, and the substrate form a flip-chip package. Further, a plurality of balls may form a ball grid array at the backside of the substrate and connect the flip-chip package to a PCB.

A Package on Package (PoP) device is an IC packaging technique to vertically combine multiple packages. Two or more packages are installed on top of one another, i.e. stacked, with an interface to route signals between them. This allows higher density, for example in the mobile telephone/PDA market. In a PoP device, individual dies may be packaged either separately or with multiple dies in each separate individual package, and then the separate individual packages may be brought together and interconnected to form a PoP device so that the individual dies in the separate individual packages may be integrated together in order to perform desired tasks.

The PoP technology is ideally suited for wireless communication systems that merge computing and communications. Wireless communication systems that merge computing and communications require different system hardware technologies with multi-functions, such as digital, analog, radio frequency (RF), and optical circuitries. A wireless communication system may include various dies such as baseband processors, wireless transceivers, memory, antennas, and discrete passive components such as resistors and capacitors. Power distribution network impedance can be high among various components of a wireless communication system and needs to be reduced.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 1(a)-1(c) illustrate in cross sectional views a method and apparatus of forming a package on package (PoP) device for a system in accordance with some embodiments; and FIGS. 2(a)-2(d) illustrate in cross sectional views an additional method and apparatus of forming a PoP device for a system in accordance with some embodiments.

Figure 1C:
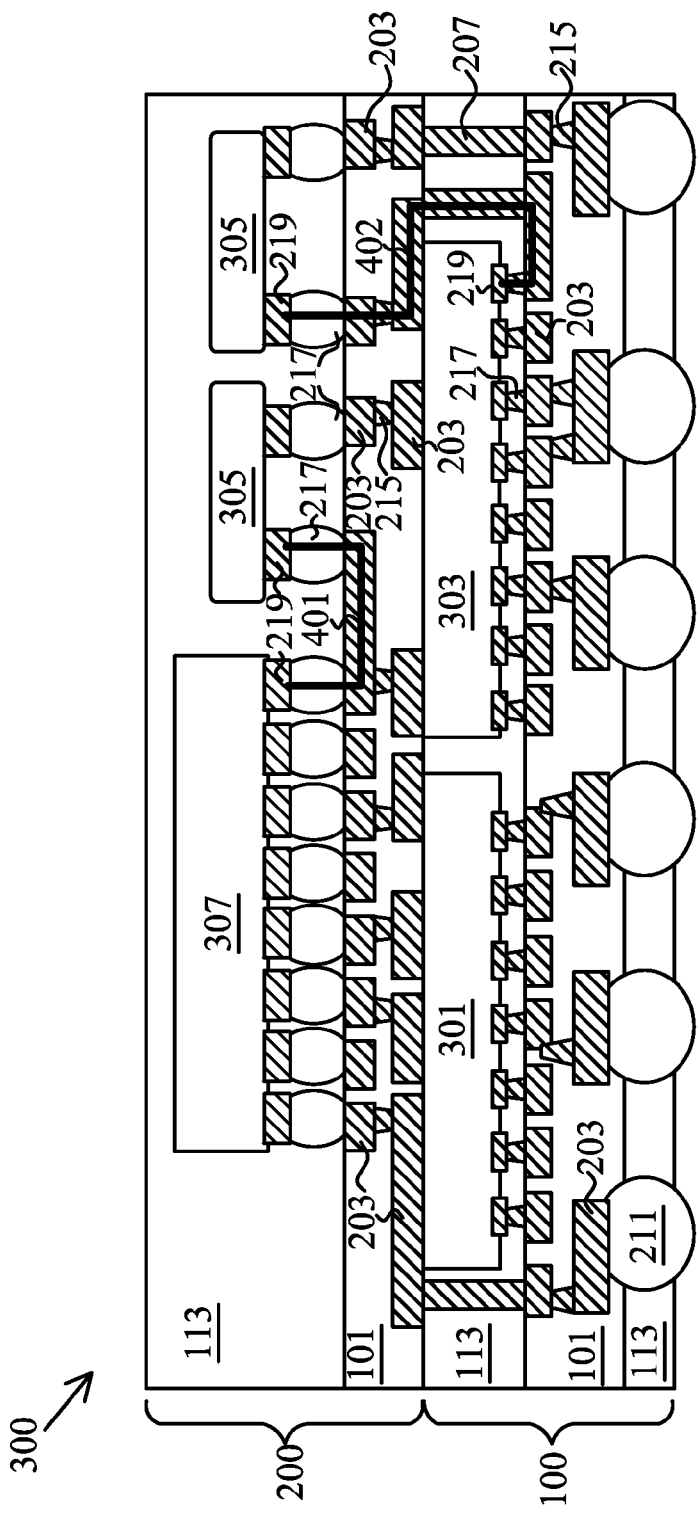

The drawings, schematics and diagrams are illustrative and not intended to be limiting, but are examples of embodiments of the disclosure, are simplified for explanatory purposes, and are not drawn to scale.

DETAILED DESCRIPTION OF ILLUSTRATIVE EMBODIMENTS

The making and forming of the present exemplary embodiments are discussed in detail below. It should be appreciated, however, that embodiments of the present disclosure provide many applicable inventive concepts that can be embodied in a wide variety of specific contexts. The specific embodiments discussed are merely illustrative of specific ways to make and use the disclosure, and do not limit the scope of the disclosure.

Methods and apparatus are disclosed for a package or a package-on-package (PoP) device. An IC package or a PoP device may comprise an electrical path connecting a die and a decoupling capacitor, wherein the electrical path may have a width in a range from about 8 um to about 44 um and a length in a range from about 10 um to about 650 um. The decoupling capacitor and the die may be contained in a same package, or at different packages within a PoP device, connected by contact pads, redistribution layers (RDLs), and connectors. The power distribution network (PDN) impedance of the so formed electrical path may be less than about 25 Ohm when the system is operating at the 3 GHz band, which may have advantages over other length for the electrical path.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"— when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

As illustrated in FIG. 1(a), a first package 100, which may be a bottom package of a package on package (PoP) device, has a first substrate 101. A redistribution layer (RDL) 203 may be placed at a front side and a backside of the substrate 101 and connected by a plurality of through vias (TVs) 215 through the substrate 101. The TVs 215 may comprise various via types, such as through molding vias (TMVs) or through assembly vias (TAVs). A first integrated circuit (IC) die 301 with a plurality of contact pads 219 may be connected by connectors 217 to the RDLs 203 at the front side of the substrate 101. An optional additional IC die 303 with a plurality of contact pads 219 may be connected by connectors 217 to the RDLs 203 at the front side of the substrate 101 as well. The dies 301 and 303 may be surrounded by a molding compound 113. A plurality of solder balls 211 may be placed at the backside of the substrate 101, and connected to the RDL 203 at the backside of the substrate 101. A molding compound 113 may cover part of the solder balls 211.

The substrate 101 may be, e.g., a silicon substrate, doped or undoped, or an active layer of a silicon-on-insulator (SOI) substrate, used to provide support. The substrate 101 may alternatively be a glass substrate, a ceramic substrate, a polymer substrate, or any other substrate that may provide a suitable protection and/or interconnection functionality. For example, the substrate 101 may be formed from polymer films, such as polyethylene terephthalate, kapton, polyimide, or other flexible polymer films. These and any other suitable materials may alternatively be used for the substrate 101. These substrates and any other suitable substrates are fully intended to be included within the scope of the present embodiments.

The redistribution layer (RDL) 203 may be placed at the front side and the backside of the substrate 101 and connected by a plurality of TVs 215 through the substrate 101. The RDL 203 at the front side of the substrate 101 provides an electrical connection between the connectors 217 and the die 301 to the substrate 101, and the RDL 203 at the backside of the substrate 101 provides an electrical connection between the contacts on the substrate 101 and the solder balls 211. The RDL 203 may be formed of alternating layers of dielectric and conductive material and may be formed through any suitable process, such as deposition, damascene, dual damascene, etc., and by an electrolytic plating, sputtering, chemical vapor deposition (CVD), plasma enhanced CVD (PECVD), or electroless plating process. The RDL 203 may be made with, e.g., Al, Cu, or a Cu alloy. The RDL 203 can be made with a single layer, or multiple layers using an adhesion layer of Ti, TiW, TaN, Ta, or Cr, for example. The substrate 101 may comprise a number of RDLs 203 to form a network of inter-level interconnects according to the function of the system.

In some embodiments, the substrate 101 may optionally comprise a passivation layer, not shown, or other protective layer disposed on the RDLs 203. The passivation layer may be an oxide, a nitride, an anticorrosion coating, or another suitable coating The through vias (TVs) 215 may provide electrical connections through the substrate 101 to connect the RDLs 203 at the front side and at the backside of the substrate 101. The TVs 215 may be formed by applying and developing a suitable photoresist, and then etching the substrate 101 to generate TV openings. The openings for the TVs 215 may be formed to extend into the substrate 101 to a depth at least greater than the eventual desired height. Accordingly, the depth may be between about 1 µm and about 700 µm below the surface on the substrate 101. The openings for the TVs 215 may have a diameter of between about 1 µm and about 100 µm. Then the openings for the TVs 215 may be filled by a barrier layer and a conductive material, using a process such as CVD, PECVD, sputtering, or metal organic chemical vapor deposition (MOCVD). Excessive barrier layer and excessive conductive material outside of the openings for the TVs 215 may be removed through a grinding process such as chemical mechanical polishing (CMP). Afterwards, a thinning of the second side of the substrate 101 may be performed by a planarization process such as CMP or etching, in order to expose the openings for the TVs 215 and to form the TVs 215 from the conductive material that extends through the substrate 101.

The dies 301 and 303 may be IC chips formed from a semiconductor wafer. The dies 301 and 303 may be any suitable integrated circuit die for a particular application. For example, the dies 301 and 303 may be a memory chip, such as a DRAM, SRAM, NVRAM, or a logic circuit. The dies 301 and 303 may be chips for a wireless communication system that merges computing and communications together and comprises different system hardware technologies with multi-functions, such as digital, analog, radio frequency (RF), and optical circuitries. The dies 301 and 303 may be components for a wireless communication system such as a baseband processor, a wireless transceiver, a memory chip, an antenna, or a discrete passive component such as a resistor.

The contact pads 219 may be formed on the dies 301 and 303. The contact pads 219 are formed to connect the signals within the dies 301 and 303 to signals of the package 100 outside the dies 301 and 303. In one embodiment, the contact pads 219 may be formed through a deposition process such as electroplating, CVD, PECVD, physical vapor deposition (PVD), sputtering, or another process. The contact pads 219 may be formed of any suitable conductive material, such as aluminum (Al), copper (Cu), tin (Sn), nickel (Ni), gold (Au), silver (Ag), or other electrically conductive material.

The dies 301 and 303 may be mounted on the front side of the substrate 101, via a plurality of connectors 217 connected to the contact pads 219 of the dies 301 and 303, using a flip-chip wafer level package (WLP) and wire bonding technique, or using a flip-chip and bump-on-trace (BOT) technique. The number of connectors 217 is only for illustrative purposes, and is not limiting. A connector 207 may be a mounting stud, a conductive pillar, or a solder ball. As long as a component may provide an electronic connection, the component may be called a connector. The connectors 217 may be formed of any suitable conductive material, for example, copper, gold, tungsten, aluminum, alloys of any of the same, or the like. If the connectors 217 are solder balls, they may be formed using a ball mount process, followed by a solder reflow process. The connectors 217 may alternatively be formed using other methods.

The molding compound 113 may be used to strengthen the attachment of the dies 301 and 303 to the substrate 101 and help to prevent the thermal stresses from breaking the connections between the dies 301 and 303 and the substrate 101. Generally, the material for molding compound 113 may be a nonconductive material, and may be an epoxy, a resin, a moldable polymer, or the like. Initially, liquid organic resin may be applied that flows into the gap between the dies 301 and 303 and the surface of the substrate 101, which subsequently cures through a chemical reaction, such as in an epoxy or resin, to control the shrinkage that occurs in the molding compound 113 during curing.

A plurality of solder balls 211 may be placed at the backside of the substrate 101, and connected to the RDL 203 at the backside of the substrate 101. Solder balls are widely used to form electrical interconnect in flip chip technology or other types of technologies for IC packaging. Various sizes of solder balls or bumps are in use. A solder ball of a diameter size around 350 um to 500 um may be called a package bump and used to connect a device to a printed circuit board (PCB). A solder bump of a diameter size around 100 um to 150 um may be called a flip-chip bump and used to connect a device to a package substrate. A solder ball may be of a diameter size from about 10 um to about 50 um and used to connect to through vias. The sizes of different solder balls or bumps are described for illustration purpose only and are not limiting. With the continuous reduction of feature sizes and package sizes, the sizes in embodiments may become smaller than the ones described above. On the other hand, the solder ball 211 may be of a bigger size such as a size of a flip-chip bump or a package bump as well, depending on the particular applications of interest.

A solder ball 211 may be a solder ball comprising an electrically conductive solder material, e.g., Sn, Ni, Au, Ag, Cu, bismuthinite (Bi) and alloys thereof, or combinations of other electrically conductive material. For example, a solder ball 211 may be a Cu/SnAg solder ball. Alternatively, a copper bump instead of a solder ball may be used as the solder ball 211. The solder balls 211 provide a means of connecting the package 100 to one or more additional substrates and may be arranged, for example, as a ball grid array (BGA).

It should be noted that the description of the package 100 described above is provided for illustrative purposes only and that other structures/devices may be substituted for the package 100.

As illustrated in FIG. 1(b), a second package 200, which may be a top package of a package on package (PoP) device, has a second substrate 101. A redistribution layer (RDL) 203 may be placed at a front side and a backside of the substrate 101 and connected by a plurality of through vias (TVs) 215 through the substrate 101. The TVs 215 may comprise various via types, such as through molding vias (TMVs) or through assembly vias (TAVs). An IC die 307 with a plurality of contact pads 219 may be connected by connectors 217 to the RDLs 203 at the front side of the substrate 101. A decoupling capacitor 305 with a plurality of contact pads 219 may be connected by connectors 217 to the RDLs 203 at the front side of the substrate 101 as well. An optional additional decoupling capacitor 305 with a plurality of contact pads 219 may be further connected by connectors 217 to the RDLs 203 at the front side of the substrate 101. The die 307 and the decoupling capacitors 305 may be surrounded by a molding compound 113.

For the package 200, detailed descriptions about the substrate 101, the RDL 203, the TVs 215, the die 307, the contact pads 219, and the molding compound 113 are similar to the descriptions for the corresponding components within the package 100.

The decoupling capacitor 305 may be an aluminum electrolytic capacitor, a solid tantalum capacitor, an aluminum-polymer capacitor, a special polymer capacitor, a poscap capacitor, an os-con capacitor, a multiple layer ceramic capacitor (MLCC). When the decoupling capacitor 305 is a MLCC, it may be a fixed capacitor with a ceramic material acting as the dielectric. It may be constructed of two or more alternating layers of ceramic with metal layers acting as the electrodes. The decoupling capacitor 305 may be a class I temperature compensating (T.C.) type MLCC capacitor, a class II high-dielectric constant (high-k) type MLCC capacitor, or a class III semi-conducting (S.C.) type MLCC capacitor. The decoupling capacitor 305 may be other type capacitor such as a safety recognized type with epoxy resin coating. The decoupling capacitor 305 may have a capacitance at a range from about 0.47 uF to about 10000 uF. The decoupling capacitor 305 may be used in a temperature at a range from about −25 C to about 105 C.

The connectors 217 as illustrated in FIG. 1(b) may be contact bumps such as micro-bumps or controlled collapse chip connection (C4) bumps and may comprise a material such as tin, or other suitable materials, such as silver or copper. In an embodiment in which the connectors 217 are tin solder bumps, the connectors 217 may be formed by initially forming a layer of tin through any suitable method such as evaporation, electroplating, printing, solder transfer, ball placement, etc., to a preferred thickness of about 100 μm. Once a layer of tin has been formed above the structure, a reflow may be performed in order to shape the material into the desired bump shape.

A first electrical path 401 connects the die 307 and the decoupling capacitor 305 within the package 200, so that electrical signal can travel between the die 307 and the decoupling capacitor 305. The electrical path 401 comprises a first contact pad 219 of the die 307, a RDL 203 of the substrate 101, a first connector 217 connecting the first contact pad 219 to the RDL 203 of the substrate 101, a second contact pad 219 of the decoupling capacitor 305, and a second connector 217 connecting the RDL 203 to the second contact pad 219. The length of the electrical path 401 is the length of the path from the first contact pad 219 of the die 307 to the second contact pad 219 of the decoupling capacitor 305. The width of the electrical path 401 is the narrowest width of the path from the first contact pad 219 of the die 307 to the second contact pad 219 of the decoupling capacitor 305, which is the smallest size of the sizes of the components along the path, comprising a diameter of the first connector 217, a diameter of the second connector 217, a size of the first contact pad 219, a size of the second contact pad 219, and the width of the RDL 203 of the substrate 101 connecting the first connector 217 and the second connector 217.

The die 307 may be a component for a wireless communication system such as a baseband processor, a wireless transceiver, a memory chip, an antenna, or a discrete passive component such as a resistor. The decoupling capacitor 305 may be another component of the wireless communication system. Power distribution network (PDN) impedance can be high among various components of a wireless communication system and needs to be reduced. The length of the electrical path 401 may provide certain constraint on the power integrity performance between the die 307 and the decoupling capacitor 305. In an embodiment, the electrical path 401 has a width in a range from about 8 um to about 44 um and a length in a range from about 10 um to about 650 um. For example, the electrical path 401 may have a width about 10 um and a length less than about 450 um. As another example, the electrical path 401 may have a width about 40 um and a length less than about 600 um. The PDN impedance of the electrical path 401 when so formed may be less than about 25 Ohm when the system is operating at the 3 GHz band, which may have advantages over other length for the electrical path 401.

More electrical paths between the decoupling capacitor 305 of the package 200 and other dies may be formed within a package or within a PoP device. As illustrated in FIG. 1(c), the first package 100 and the second package 200 may be electrically coupled to form a package-on-package (PoP) device 300, where the package 200 is placed on the package 100. The RDL 203 of the package 100 at the front side of the substrate 101 is connected to the RDL 203 of the package 200 at the backside of the substrate 101 by through assembly vias (TAVs) 207. The TAVs 207 connects a RDL 203 of the top package 200, extends vertically through a portion of the bottom package 100, to connect the RDL 203 formed in the substrate 101 of the bottom package 100. The TAVs 207 may be formed by first forming openings in the molding 113 and the substrate 101 of the bottom package 100. A plurality of TAVs 207 may be formed in the plurality of openings using a plating process, such as for example electrochemical plating, electroless plating, sputtering, CVD, and the like. The plurality of TAVs 207 may be formed of a conductive material, which may include copper, aluminum, tungsten, and/or the like. The RDL 203 of the top package 200 may be connected to the TAVs 207 through some contact pads of the top package 200, which are not shown.

A second electrical path 402 is shown in FIG. 1(c), formed between the decoupling capacitor 305 of the top package 200 and the die 303 of the bottom package 100. The electrical path 402 comprises a first contact pad 219 of the die 303, a first RDL 203 of the substrate 101, and a first connector 217 connecting the first contact pad 219 to the first RDL 203, all within the bottom package 100. The electrical path 402 further comprises a second contact pad 219 of the decoupling capacitor 305, a second RDL 203 at the front side of the substrate 101, and a second connector 217 connecting the second contact pad 219 to the second RDL 203, all within the top package 200. The electrical path 402 further comprises a TV 215 connecting the second RDL 203 at the front side of the substrate 101 to a third RDL 203 at the backside of the substrate 101 of the top package 200. The electrical path 402 further comprises a TAV 207 connecting the third RDL 203 of the package 200 to the first RDL 203 of the bottom package 100.

The length of the electrical path 402 is the length of the path from the first contact pad 219 of the die 303 to the second contact pad 219 of the decoupling capacitor 305. The width of the electrical path 402 is the narrowest width of the path from the first contact pad 219 of the die 303 to the second contact pad 219 of the decoupling capacitor 305, which is the smallest size of the sizes of the components along the path, comprising a diameter of the first connector 217, a diameter of the second connector 217, a size of the first contact pad 219, a size of the second contact pad 219, the width of the first RDL 203, the width of the second RDL 203, the width of the third RDL 203, the width of the TV 215, and the width of the TAV 207.

The length of the electrical path 402 may provide certain constraint on the power integrity performance between the die 303 and the decoupling capacitor 305. In an embodiment, the electrical path 402 has a width in a range from about 8 um to about 44 um and a length in a range from about 10 um to about 650 um. For example, the electrical path 402 may have a width about 10 um and a length less than about 450 um. As another example, the electrical path 402 may have a width about 40 um and a length less than about 600 um. The PDN impedance of the electrical path 402 when so formed may be less than about 25 Ohm when the system is operating at the 3 GHz band, which may have advantages over other length for the electrical path 402.

The electrical path connecting a decoupling capacitor and a die shown in FIGS. 1(b)-1(c) are for examples only. There are many variations of such electrical paths connecting a decoupling capacitor and a die within a package or within a PoP device. More embodiments are shown in FIGS. 2(a)-2(d).

Figures 2A, 2B:
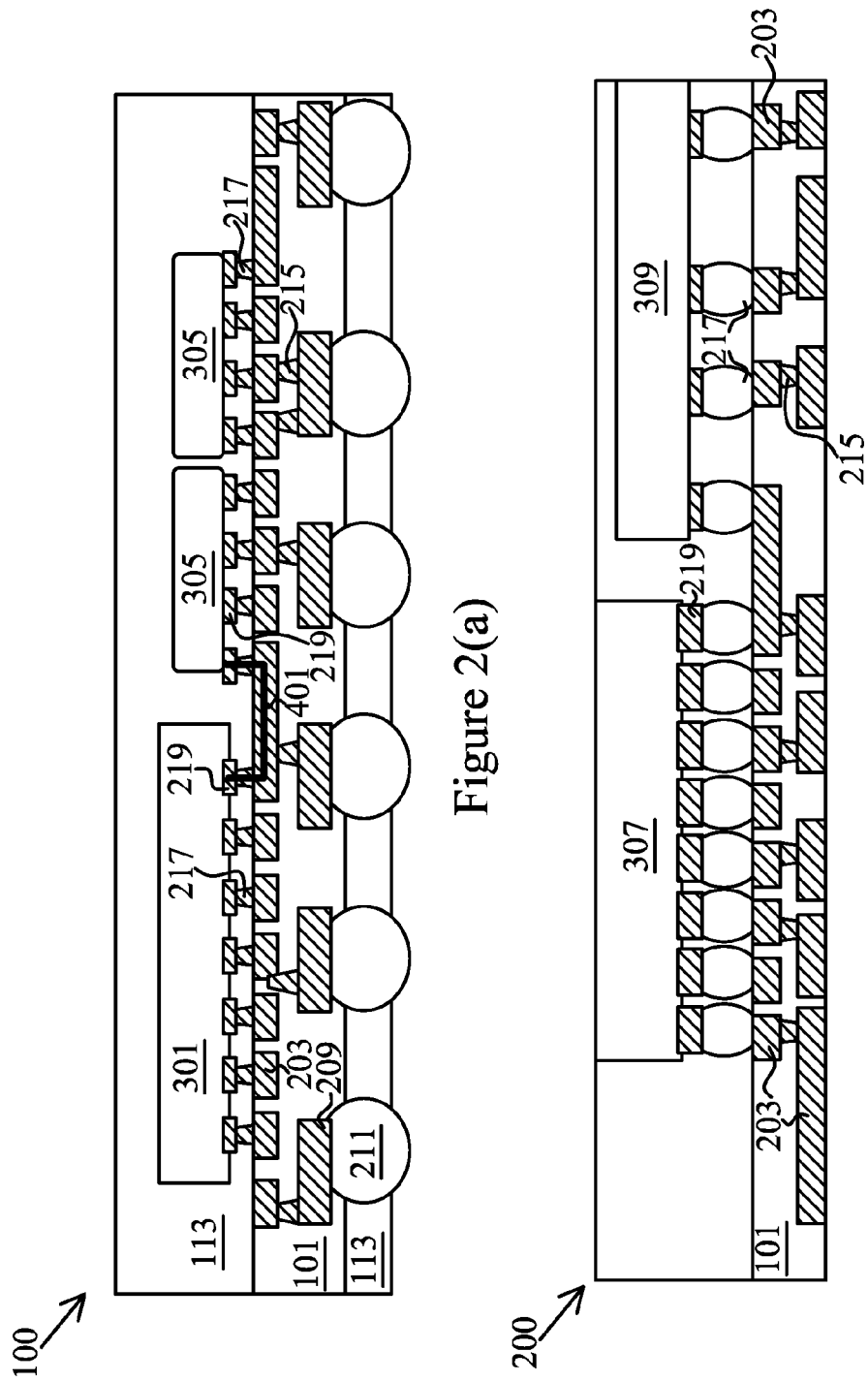

As illustrated in FIG. 2(a), a first package 100, which may be a bottom package of a package on package (PoP) device, has a substrate 101. A redistribution layer (RDL) 203 may be placed at a front side and a backside of the substrate 101 and connected by a plurality of through vias (TVs) 215 through the substrate 101. An IC die 301 with a plurality of contact pads 219 may be connected by connectors 217 to the RDLs 203 at the front side of the substrate 101. A decoupling capacitor 305 with a plurality of contact pads 219 may be connected by connectors 217 to the RDLs 203 at the front side of the substrate 101 as well. An optional additional decoupling capacitor 305 with a plurality of contact pads 219 may be further connected by connectors 217 to the RDLs 203 at the front side of the substrate 101. The die 301 and the decoupling capacitor 305 may be surrounded by a molding compound 113. A plurality of solder balls 211 may be placed at the backside of the substrate 101, and connected to the RDL 203 at the backside of the substrate 101. A molding compound 113 may cover part of the solder balls 211. Details about the substrate 101, the RDL 203, the TVs 215, the die 301, the contact pads 219, the connectors 217, the solder balls 211, and the molding compound 113 are similar to the descriptions previously given.

A first electrical path 401 connects the die 301 and the decoupling capacitor 305 within the package 100, so that electrical signal can travel between the die 301 and the decoupling capacitor 305. The electrical path 401 comprises a first contact pad 219 of the die 301, a RDL 203 of the substrate 101, a first connector 217 connecting the first contact pad 219 to the RDL 203 of the substrate 101, a second contact pad 219 of the decoupling capacitor 305, and a second connector 217 connecting the RDL 203 to the second contact pad 219. The length of the electrical path 401 is the length of the path from the first contact pad 219 of the die 301 to the second contact pad 219 of the decoupling capacitor 305. The width of the electrical path 401 is the narrowest width of the path from the first contact pad 219 of the die 301 to the second contact pad 219 of the decoupling capacitor 305, which is the smallest size of the sizes of the components along the path, comprising a diameter of the first connector 217, a diameter of the second connector 217, a size of the first contact pad 219, a size of the second contact pad 219, and the width of the RDL 203 of the substrate 101 connecting the first connector 217 and the second connector 217.

The length of the electrical path 401 may provide certain constraint on the power integrity performance between the die 301 and the decoupling capacitor 305. In an embodiment, the electrical path 401 has a width in a range from about 8 um to about 44 um and a length in a range from about 10 um to about 650 um. The PDN impedance of the electrical path 401 when so formed may be less than about 25 Ohm when the system is operating at the 3 GHz band, which may have advantages over other length for the electrical path 401.

As illustrated in FIG. 2(b), a second package 200, which may be a top package of a package on package (PoP) device, has a substrate 101. A redistribution layer (RDL) 203 may be placed at a front side and a backside of the substrate 101 and connected by a plurality of through vias (TVs) 215 through the substrate 101. A first IC die 307 with a plurality of contact pads 219 may be connected by connectors 217 to the RDLs 203 at the front side of the substrate 101. An optional additional IC die 309 with a plurality of contact pads 219 may be connected by connectors 217 to the RDLs 203 at the front side of the substrate 101 as well. The dies 307 and 309 may be surrounded by a molding compound 113. Details about the substrate 101, the RDL 203, the TVs 215, the dies 307 and 309, the contact pads 219, and the molding compound 113 are similar to the descriptions previously given. The connectors 217 may be contact bumps such as microbumps or controlled collapse chip connection (C4) bumps and may comprise a material such as tin, or other suitable materials, such as silver or copper.

As illustrated in FIG. 2(c), the first package 100 and the second package 200 may be electrically coupled to form a package-on-package (PoP) device 300, where the package 200 is placed on the package 100. The RDL 203 of the package 100 is connected to the RDL 203 of the package 200 by through assembly vias (TAVs) 207. The TAVs 207 connects a RDL 203 of the top package 200, extends vertically through a portion of the bottom package 100, to connect the RDL 203 formed in the substrate 101 of the bottom package 100. The RDL 203 of the top package 200 may be connected to the TAVs 207 through some contact pads of the top package 200, which are not shown.

A second electrical path 402 is shown in FIG. 2(c), formed between the decoupling capacitor 305 of the bottom package 100 and the die 309 of the top package 200. The electrical path 402 comprises a first contact pad 219 of the die 309, a first RDL 203 at the front side of the substrate 101, and a first connector 217 connecting the first contact pad 219 to the first RDL 203 within the top package 200. The electrical path 402 further comprises a TV 215 connecting the first RDL 203 at the front side of the substrate 101 to a second RDL 203 at the backside of the substrate 101 of the top package 200. The electrical path 402 further comprises a second contact pad 219 of the decoupling capacitor 305, a third RDL 203 at the front side of the substrate 101, and a second connector 217 connecting the second contact pad 219 to the third RDL 203, all within the bottom package 100. The electrical path 402 further comprises a TAV 207 connecting the second RDL 203 of the top package 200 to the third RDL 203 of the bottom package 100.

The length of the electrical path 402 is the length of the path from the first contact pad 219 of the die 309 to the second contact pad 219 of the decoupling capacitor 305. The width of the electrical path 402 is the narrowest width of the path from the first contact pad 219 of the die 309 to the second contact pad 219 of the decoupling capacitor 305, which is the smallest size of the sizes of the components along the path, comprising a diameter of the first connector 217, a diameter of the second connector 217, a size of the first contact pad 219, a size of the second contact pad 219, the width of the first RDL 203, the second RDL 203, the third RDL 203, the width of the TV 215, and the width of the TAV 207.

The length of the electrical path 402 may provide certain constraint on the power integrity performance between the die 309 and the decoupling capacitor 305. In an embodiment, the electrical path 402 has a width in a range from about 8 um to about 44 um and a length in a range from about 10 um to about 650 um. The PDN impedance of the electrical path 402 when so formed may be less than about 25 Ohm when the system is operating at the 3 GHz band, which may have advantages over other length for the electrical path 402.

As illustrated in FIG. 2(d), a third electrical path 403 is formed between the decoupling capacitor 305 of the bottom package 100 and the die 307 of the top package 200, all within a PoP device 300 with details similar to the PoP device 300 shown in FIG. 2(c). The electrical path 403 comprises a first contact pad 219 of the die 307, a first RDL 203 at the front side of the substrate 101, and a first connector 217 connecting the first contact pad 219 to the first RDL 203, all within the top package 200. The electrical path 403 further comprises a TV 215 connecting the first RDL 203 at the front side of the substrate 101 to a second RDL 203 at the backside of the substrate 101 of the top package 200. The electrical path 403 further comprises a second contact pad 219 of the decoupling capacitor 305, a third RDL 203 at the front side of the substrate 101, and a second connector 217 connecting the second contact pad 219 to the third RDL 203, all within the bottom package 100. The electrical path 403 further comprises a TAV 207 connecting the second RDL 203 of the top package 200 to the third RDL 203 of the bottom package 100. The decoupling capacitor 305 is connected to the die 309 by the second electrical path 402 as shown in FIG. 2(c).

The length of the electrical path 403 is the length of the path from the first contact pad 219 of the die 307 to the second contact pad 219 of the decoupling capacitor 305. The width of the electrical path 403 is the narrowest width of the path from the first contact pad 219 of the die 307 to the second contact pad 219 of the decoupling capacitor 305, which is the smallest size of the sizes of the components along the path, comprising a diameter of the first connector 217, a diameter of the second connector 217, a size of the first contact pad 219, a size of the second contact pad 219, the width of the first RDL 203, the second RDL 203, the third RDL 203, the width of the TV 215, and the width of the TAV 207.

The length of the electrical path 403 may provide certain constraint on the power integrity performance between the die 307 and the decoupling capacitor 305. In an embodiment, the electrical path 403 has a width in a range from about 8 um to about 44 um and a length in a range from about 10 um to about 650 um. The PDN impedance of the electrical path 402 when so formed may be less than about 25 Ohm when the system is operating at the 3 GHz band, which may have advantages over other length for the electrical path 402.

Although the illustrative embodiment and its advantages have been described in detail, it should be understood that various changes, substitutions, and alterations can be made herein without departing from the spirit and scope of the disclosure as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package device, comprising:
   a first package comprising a first substrate, a first die above the first substrate, a first decoupling capacitor and a second decoupling capacitor above the first substrate, a first molding compound encapsulating the first die, first decoupling capacitor and the second decoupling capacitor, and a first electrical path connecting the first die and the first decoupling capacitor, wherein the first electrical path has a first width in a range from about 8 μm to about 44 μm, and wherein the first electrical path comprises a first length measured from the first die to the first decoupling capacitor in a range from about 10 μm to about 650 μm;
   a second package comprising a second substrate, a second die above the second substrate, and a second molding compound encapsulating the second die, wherein the second package is a bottom package of a first package-on-package (PoP) device and the first package is a top package of the first PoP device; and
   a second electrical path connecting the second die and the second decoupling capacitor, wherein the second electrical path has a second width in a range from about 8 μm to about 44 μm and a second length in a range from about 10 μm to about 650 μm, wherein the second electrical path comprises a first redistribution layer (RDL) on the second substrate and does not extend through any dies.

2. The package device of claim 1, wherein the first decoupling capacitor is an aluminum electrolytic capacitor, a solid tantalum capacitor, an aluminum-polymer capacitor, a special polymer capacitor, a poscap capacitor, an os-con capacitor, or a multiple layer ceramic capacitor.

3. The package device of claim 1, wherein the first die comprises a baseband processor, a wireless transceiver, a memory chip, an antenna, or a passive component.

4. The package device of claim 1, wherein the first electrical path comprises a first contact pad of the first die, a second RDL on the first substrate, a first connector connecting the first contact pad and the second RDL, a second contact pad of the first decoupling capacitor, and a second connector connecting the second contact pad and the second RDL.

5. The package device of claim 4, wherein:
   the first connector is a mounting stud, a conductive pillar, a solder ball, a micro-bump, or a controlled collapse chip connection (C4) bump; and
   the second connector is a mounting stud, a conductive pillar, a solder ball, a micro-bump, or a controlled collapse chip connection (C4) bump.

6. The package device of claim 1, wherein the second electrical path further comprises a third contact pad of the second die, a third connector connecting the third contact pad and the first RDL, a fourth contact pad of the second decoupling capacitor, a third RDL on the first substrate, a fourth connector connecting the fourth contact pad and the third RDL, and a through via connecting the first RDL and the third RDL, wherein the through via extends through the second molding compound.

7. The package device of claim 1, further comprising:
   a third die contained within the first package or the second package; and
   a third electrical path connecting the third die and the first decoupling capacitor, wherein the third electrical path has a third width in a range from about 8 μm to about 44 μm and a third length in a range from about 10 μm to about 650 μm.

8. A package-on-package (PoP) device, comprising:
   a first package comprising a first substrate, a first redistribution layer (RDL) on the first substrate, a first decoupling capacitor above the first substrate and being connected to the first RDL, and a molding compound encapsulating the first decoupling capacitor;
   a second package comprising a second substrate over the first decoupling capacitor, a second RDL on a top surface of the second substrate, a third RDL on a bottom surface of the second substrate, and a first die above the top surface of the second substrate and being connected to the second RDL, wherein a portion of the molding compound is disposed between the first decoupling capacitor and the second substrate;
   a first through via (TV) in the molding compound, the first TV connecting the first RDL of the first package and the third RDL of the second package; and
   a first electrical path connecting the first die and the first decoupling capacitor, wherein the first electrical path comprises the first TV, wherein the first electrical path has a first width in a range from about 8 μm to about 44 μm, and wherein the first electrical path has a first length measured from a first contact pad of the first die to a second contact pad of the first decoupling capacitor in a range from about 10 μm to about 650 μm.

9. The PoP device of claim 8, wherein the first decoupling capacitor is an aluminum electrolytic capacitor, a solid tantalum capacitor, an aluminum-polymer capacitor, a special polymer capacitor, a poscap capacitor, an os-con capacitor, or a multiple layer ceramic capacitor.

10. The PoP device of claim 8 further comprising:
    a second TV in the molding compound;
    a second die adjacent the first die above the top surface of the second substrate and connected to the second RDL; and
    a second electrical path between the second die and the first decoupling capacitor, wherein the second electrical path has a second width in a range from about 8 μm to about 44 μm and a second length in a range from about 10 µm to about 650 µm, and wherein the second electrical path comprises the second TV.

11. The PoP device of claim 8, wherein the first electrical path further comprises a first contact pad of the first decoupling capacitor connected to the first RDL by a first connector, and a second contact pad of the first die connected to the second RDL by a second connector.

12. A package device, comprising:
- a first substrate;
- a first redistribution layer (RDL) on a top surface of the first substrate, a second RDL on a bottom surface of the first substrate, and a through via extending through the first substrate from the top surface to the bottom surface and electrically connecting the first RDL and the second RDL;
- a capacitor atop the top surface of the first substrate, the capacitor having a first contact pad and being electrically connected to the first RDL via the first contact pad and a first connector;
- a molding compound above the first RDL, the molding compound encapsulating the capacitor;
- a first through via (TV) and a second TV extending through the molding compound, the capacitor being interposed between the first TV and the second TV;
- a second substrate over the capacitor and the molding compound;
- a first integrated circuit (IC) component bonded to a surface of the second substrate opposite the capacitor;
- a second IC component adjacent the first IC component and bonded to the surface of the second substrate opposite the capacitor;
- a first electrical path electrically connecting the first IC component and the capacitor through the first TV; and
- a second electrical path electrically connecting the second IC component and the capacitor through the second TV, wherein the first and the second electrical paths each have a length measured from a respective one of the first and the second IC component to the capacitor of about 10 µm to about 650 µm and has along the length a narrowest width of from about 8 µm to about 44 µm.

13. The package device of claim 12, wherein the first electrical path comprises the first contact pad, the first connector, and a portion of the first RDL.

14. The package device of claim 12, wherein the capacitor is a decoupling capacitor.

15. The package device of claim 1, wherein the first electrical path has a power distribution network (PDN) impedance of less than about 25 ohm when operating at 3 GHz.

16. The package device of claim 1, wherein the second package further comprises a third molding compound, the second substrate being interposed between the second molding compound and the third molding compound.

17. The PoP device of claim 8, wherein the first electrical path has a power distribution network (PDN) impedance of less than about 25 ohm when operating at 3 GHz.

18. The PoP device of claim 8 further comprising a third die in the molding compound, wherein the molding compound is not disposed between the second substrate and the third die.

19. The PoP device of claim 10, wherein the second TV is disposed on an opposing side of the first decoupling capacitor as the first TV.

20. The package device of claim 12 further comprising:
- an additional capacitor on an opposing side of the first TV as the capacitor;
- a third IC component adjacent the additional capacitor; and
- a third electrical path electrically connecting the third IC component and the additional capacitor through the first substrate.

* * * * *